United States Patent
Liu et al.

(10) Patent No.: US 10,817,636 B2
(45) Date of Patent: Oct. 27, 2020

(54) METHODOLOGY USING FIN-FET TRANSISTORS

(71) Applicant: Synopsys, Inc., Mountain View, CA (US)

(72) Inventors: Bohai Liu, Shanghai (CN); Gang Ni, Shanghai (CN); Chunlei Zhu, Shanghai (CN); Gary K. Yeap, Fremont, CA (US)

(73) Assignee: SYNOPSYS, INC., Mountain View, CA (US)

( * ) Notice: Subject to any disclaimer, the term of this patent is extended or adjusted under 35 U.S.C. 154(b) by 707 days.

(21) Appl. No.: 14/924,323

(22) Filed: Oct. 27, 2015

(65) Prior Publication Data

US 2016/0125116 A1    May 5, 2016

Related U.S. Application Data

(60) Provisional application No. 62/073,880, filed on Oct. 31, 2014.

(51) Int. Cl.
*G06F 17/50* (2006.01)
*G06F 30/392* (2020.01)

(52) U.S. Cl.
CPC .................. *G06F 30/392* (2020.01)

(58) Field of Classification Search
CPC .................................................. G06F 17/5072
USPC ........................................................ 716/122
See application file for complete search history.

(56) References Cited

U.S. PATENT DOCUMENTS

| | | | | |
|---|---|---|---|---|
| 2010/0187575 | A1* | 7/2010 | Baumgartner | H01L 21/82343 257/255 |
| 2012/0280331 | A1* | 11/2012 | Ou | H01L 21/82343 257/401 |
| 2014/0065802 | A1* | 3/2014 | Chang | H01L 21/845 438/479 |
| 2014/0097493 | A1* | 4/2014 | Baek | H01L 27/1211 257/347 |
| 2016/0197092 | A1* | 7/2016 | Hong | H01L 27/11582 257/314 |
| 2017/0287933 | A1* | 10/2017 | Chen | H01L 27/11807 |

* cited by examiner

*Primary Examiner* — Suresh Memula
(74) *Attorney, Agent, or Firm* — Alston & Bird LLP

(57) ABSTRACT

A computer implemented method for designing a circuit is presented. The method includes forming, using the computer, a multitude of cells, each cell characterized by at least first and second boundaries positioned along a first direction, and a plurality of first shapes extending along the first direction. Each first shape is spaced, along a second direction substantially orthogonal to the first direction, from a neighboring first shape in accordance with a first pitch. The first and second boundaries are further positioned in accordance with an integer multiple of the first pitch when the computer is invoked to form the plurality of cells representing the circuit.

45 Claims, 9 Drawing Sheets

700A

FORMING, USING THE COMPUTER, A MULTITUDE OF CELLS, EACH CHARACTERIZED BY: BOUNDARIES POSITIONED ALONG THE X-DIRECTION AND/OR A Y-COORDINATE OF A CELL ORIGIN, AND A MULTITUDE OF FIN SHAPES EXTENDING ALONG THE X-DIRECTION, EACH FIN SHAPE SPACED, ALONG A Y-DIRECTION, FROM A NEIGHBORING FIN SHAPE IN ACCORDANCE WITH A Y-PITCH. THE CELL BOUNDARIES POSITIONED ALONG THE X-DIRECTION AND/OR THE Y-COORDINATE OF THE CELL ORIGIN ARE FURTHER POSITIONED IN ACCORDANCE WITH A Y-OFFSET PLUS AN INTEGER MULTIPLE OF THE Y-PITCH WHEN THE COMPUTER IS INVOKED TO FORM THE PLURALITY OF CELLS REPRESENTING THE CIRCUIT. 710

↓

FORMING, USING THE COMPUTER, AT LEAST ONE BLOCK INCLUDING: THE MULTITUDE OF CELLS, AND BOUNDARIES POSITIONED ALONG THE X-DIRECTION AND/OR A Y-COORDINATE OF A CELL ORIGIN ARE FURTHER POSITIONED IN ACCORDANCE WITH THE Y-OFFSET PLUS AN INTEGER MULTIPLE OF THE Y-PITCH. 720

700A

FORMING, USING THE COMPUTER, A MULTITUDE OF CELLS, EACH CHARACTERIZED BY: BOUNDARIES POSITIONED ALONG THE X-DIRECTION AND/OR A Y-COORDINATE OF A CELL ORIGIN, AND A MULTITUDE OF FIN SHAPES EXTENDING ALONG THE X-DIRECTION, EACH FIN SHAPE SPACED, ALONG A Y-DIRECTION, FROM A NEIGHBORING FIN SHAPE IN ACCORDANCE WITH A Y-PITCH. THE CELL BOUNDARIES POSITIONED ALONG THE X-DIRECTION AND/OR THE Y-COORDINATE OF THE CELL ORIGIN ARE FURTHER POSITIONED IN ACCORDANCE WITH A Y-OFFSET PLUS AN INTEGER MULTIPLE OF THE Y-PITCH WHEN THE COMPUTER IS INVOKED TO FORM THE PLURALITY OF CELLS REPRESENTING THE CIRCUIT. 710

FORMING, USING THE COMPUTER, AT LEAST ONE BLOCK INCLUDING: THE MULTITUDE OF CELLS, AND BOUNDARIES POSITIONED ALONG THE X-DIRECTION AND/OR A Y-COORDINATE OF A CELL ORIGIN ARE FURTHER POSITIONED IN ACCORDANCE WITH THE Y-OFFSET PLUS AN INTEGER MULTIPLE OF THE Y-PITCH. 720

FORMING, USING THE COMPUTER, EACH CELL FURTHER CHARACTERIZED BY: BOUNDARIES POSITIONED ALONG THE Y-DIRECTION AND/OR A X-COORDINATE OF A CELL ORIGIN, AND A MULTITUDE OF GATE SHAPES EXTENDING ALONG THE Y-DIRECTION, EACH GATE SHAPE SPACED, ALONG THE X-DIRECTION, FROM A NEIGHBORING GATE SHAPE IN ACCORDANCE WITH A X-PITCH. THE CELL BOUNDARIES POSITIONED ALONG THE Y-DIRECTION AND/OR THE X-COORDINATE OF THE CELL ORIGIN ARE FURTHER POSITIONED IN ACCORDANCE WITH A X-OFFSET PLUS AN INTEGER MULTIPLE OF THE X-PITCH. 730

FORMING, USING THE COMPUTER, AT LEAST ONE BLOCK FURTHER INCLUDING: BOUNDARIES POSITIONED ALONG THE Y-DIRECTION AND/OR A X-COORDINATE OF A CELL ORIGIN ARE FURTHER POSITIONED IN ACCORDANCE WITH THE X-OFFSET PLUS AN INTEGER MULTIPLE OF THE X-PITCH. 740

*FIG. 7B*

METHODOLOGY USING FIN-FET TRANSISTORS

CROSS-REFERENCES TO RELATED APPLICATIONS

This application claims priority, under 35 U.S.C. § 119(e), from to U.S. Provisional Application No. 62/073,880, filed on Oct. 31, 2014, entitled "DESIGN METHODOLOGY USING FIN-FET TRANSISTORS" by Bohai Liu, et al., the contents of all of which are incorporated herein by reference in their entirety.

BACKGROUND

The conventional planar metal-oxide-semiconductor-field-effect-transistor (MOSFET), has a control gate positioned at only one side of the channel region, and has been successfully scaled down in size in accordance with Moore's law. However, below about the 20 nm technology node, planar MOSFETs exhibit significant limitations including short channel effects that result in high off-state leakage currents, which in-turn produce undesirably high standby power in integrated circuits (ICs). One non-planar or 3-dimensional MOSFET device technology has been introduced to circumvent the off-state leakage problem at small dimensions and is called a fin-field-effect-transistor (Fin-FET). A Fin-FET includes a gate that surrounds the channel region or "fin" on two or more sides so as to fully deplete the channel region in the off state. However, designs using Fin-FET technology typically must satisfy significant additional constraints not normally encountered in conventional planar MOSFET technology.

The complexity of system-on-chip (SOC) integrated circuit (IC) design has extended the use of electronic design automation (EDA) software to many aspects of circuit design including design planning, which may use a tool called an physical design tool (PDT), such as for example the IC Compiler (ICC) supplied by Synopsys, Inc. A SOC chip may contain millions of transistors and circuit interconnections, which at one stage of design may be represented by shapes in digital data called the layout or database. The layout data is transformed by mask makers into masks that are, in-turn, used to transfer the layout to chips or die on a semiconductor wafer when the IC is fabricated. Due to processor and memory limitations, it may not be possible to create a non-hierarchical or "flat" layout for the entire chip because the layout would contain too much data, e.g. data representing each of the millions of shapes in the layout. Instead, the layout is hierarchically divided into cells. Cells at a lower hierarchy level containing many shapes may be nested and/or repeatedly placed into other cells at a higher hierarchy level with little shape data. For example, a lower hierarchical level cell containing ten shapes may be placed a hundred times in another higher hierarchical level cell resulting in data for ten shapes plus a hundred and one cell placements, which requires far less data and fewer computing resources to manipulate than a non-hierarchical layout requiring data for one cell placement plus ten times a hundred shapes for the equivalent electrical circuit. However, existing EDA software tools may not adequately address the significant additional constraints required to design using Fin-FET technology without considerable customization of the EDA software at many different steps.

Therefore, there is a need to provide EDA software that automatically comprehends at most EDA steps the special constraints for designs using Fin-FET technology, without requiring considerable customization.

SUMMARY

According to one embodiment of the present invention, a computer implemented method for designing a circuit is presented. The method includes forming, using the computer, a multitude of cells. Each cell is characterized by at least first and second boundaries positioned along a first direction. Each cell is further characterized by a multitude of first shapes extending along the first direction. Each first shape is spaced, along a second direction substantially orthogonal to the first direction, from a neighboring first shape in accordance with a first pitch. The first and second boundaries are further positioned in accordance with an integer multiple of the first pitch when the computer is invoked to form the multitude of cells representing the circuit.

According to one embodiment, the first pitch is equal to a spacing along the second direction between each first shape and the neighboring first shape plus a width along the second direction of one of the first shapes. The width of each of the multitude of first shapes is the same. According to one embodiment, each first shape is associated with a different fin of a fin-field-effect-transistor (Fin-FET).

According to one embodiment, the first and second boundaries are further positioned in accordance with a first offset plus an integer multiple of the first pitch. According to one embodiment, the first and second boundaries are associated with a cell selected from the group consisting of an integrated circuit die area, a logic core area, an I/O pad, a row, a tile, a standard cell, a soft macro, a black-box, a plan-group, and a power switch.

According to one embodiment, the method further includes forming, using the computer, at least one block including the multitude of cells, and at least third and fourth boundaries positioned along the first direction in accordance with an integer multiple of the first pitch. According to one embodiment, the third and fourth boundaries are further positioned in accordance with a first offset plus an integer multiple of the first pitch. According to one embodiment, the multitude of cells are each instantiated in the at least one block such that the first and second boundaries are positioned in accordance with a first offset plus an integer multiple of the first pitch.

According to one embodiment, each cell is further characterized by at least third and fourth boundaries positioned along the second direction, and a multitude of second shapes extending along the second direction. Each second shape is spaced, along the first direction, from a neighboring second shape in accordance with a second pitch. The third and fourth boundaries are further positioned in accordance with an integer multiple of the second pitch.

According to one embodiment, the second pitch is equal to a spacing along the first direction between each second shape and the neighboring second shape plus a width along the first direction of one of the second shapes. The width of each of the multitude of second shapes is the same. According to one embodiment, each second shape is associated with a different gate of a FIN-FET.

According to one embodiment, the third and fourth boundaries are further positioned in accordance with a second offset plus an integer multiple of the second pitch. According to one embodiment, the third and fourth boundaries are associated with a cell selected from the group consisting of an integrated circuit die area, a logic core area, a I/O pad, a row, a tile, a standard cell, a soft macro, a black-box, a plan-group, and a power switch.

According to one embodiment, the method further includes forming, using the computer, at least one block including the multitude of cells, and at least fifth and sixth boundaries positioned along the second direction in accordance with the second pitch. According to one embodiment, the fifth and sixth boundaries are further positioned in accordance with a second offset plus an integer multiple of the second pitch. According to one embodiment, the multitude of cells are each instantiated in the at least one block such that the third and fourth boundaries are positioned in accordance with the second offset plus an integer multiple of the second pitch.

According to one embodiment of the present invention, a method for building a multitude of cells of a circuit is presented. The method includes forming, using a computer, a multitude of cells. Each cell is characterized by at least first and second boundaries positioned along a first direction. Each cell is further characterized by a multitude of first shapes extending along the first direction. Each first shape is spaced, along a second direction substantially orthogonal to the first direction, from a neighboring first shape in accordance with a first pitch. The first and second boundaries are further positioned in accordance with an integer multiple of the first pitch when the computer is invoked to form the multitude of cells representing the circuit. Each first shape defines a structure of an integrated circuit represented by the circuit when the integrated circuit is fabricated.

According to one embodiment of the present invention, a computer implemented method for designing a circuit is presented. The method includes forming, using the computer, a multitude of cells. Each cell is characterized by a multitude of first shapes extending along the first direction. Each first shape is spaced, along a second direction substantially orthogonal to the first direction, from a neighboring first shape in accordance with a first pitch. Each cell is further characterized by a cell origin including a first cell coordinate associated with the second direction. The first cell coordinate is assigned in accordance with an integer multiple of the first pitch when the computer is invoked to form the multitude of cells representing the circuit.

According to one embodiment, the first cell coordinate is further assigned in accordance with a first offset plus an integer multiple of the first pitch. According to one embodiment, the method further includes forming, using the computer, at least one block including the multitude of cells, and a block origin including a first block coordinate associated with the second direction. The first block coordinate is assigned in accordance with an integer multiple of the first pitch. According to one embodiment, the first block coordinate is further assigned in accordance with a first offset plus an integer multiple of the first pitch. According to one embodiment, the multitude of cells are each instantiated in the at least one block such that the first cell coordinate for each of the multitude of cells is assigned in accordance with a first offset plus an integer multiple of the first pitch.

According to one embodiment, each cell is further characterized by a multitude of second shapes extending along the second direction. Each second shape is spaced, along the first direction, from a neighboring second shape in accordance with a second pitch. The cell origin includes a second cell coordinate associated with the first direction. The second cell coordinate is assigned in accordance with an integer multiple of the second pitch. According to one embodiment, the second cell coordinate is assigned in accordance with a second offset plus an integer multiple of the second pitch.

According to one embodiment, the method further includes forming, using the computer, at least one block including the multitude of cells, and a block origin including a second block coordinate associated with the first direction. The second block coordinate is assigned in accordance with an integer multiple of the second pitch. According to one embodiment, the second block coordinate is assigned in accordance with a second offset plus an integer multiple of the second pitch. According to one embodiment, the multitude of cells are each instantiated in the at least one block such that the second cell coordinate for each of the multitude of cells is assigned in accordance with the second offset plus an integer multiple of the second pitch.

According to one embodiment of the present invention, a method for building a multitude of cells of a circuit is presented. The method includes forming, using a computer, a multitude of cells. Each cell is characterized by a multitude of first shapes extending along the first direction. Each first shape is spaced, along a second direction substantially orthogonal to the first direction, from a neighboring first shape in accordance with a first pitch. Each cell is further characterized by a cell origin including a first cell coordinate associated with the second direction. The first cell coordinate is assigned in accordance with an integer multiple of the first pitch when the computer is invoked to form the multitude of cells representing the circuit. Each first shape defines a structure of an integrated circuit represented by the circuit when the integrated circuit is fabricated.

According to one embodiment of the present invention, a computer system is operative to form a multitude of cells of a circuit. Each cell is characterized by at least first and second boundaries positioned along a first direction, and a multitude of first shapes extending along the first direction. Each first shape is spaced, along a second direction substantially orthogonal to the first direction, from a neighboring first shape in accordance with a first pitch. The first and second boundaries are further positioned in accordance with an integer multiple of the first pitch when the computer system is invoked to form the multitude of cells representing the circuit.

According to one embodiment, the computer system is further operative to form at least one block including the multitude of cells, and at least third and fourth boundaries positioned along the first direction in accordance with an integer multiple of the first pitch. According to one embodiment, the computer system is further operative to form at least one block including the multitude of cells, and at least fifth and sixth boundaries positioned along the second direction in accordance with the second pitch.

According to one embodiment of the present invention, the computer system operative to form a multitude of cells of a circuit. Each cell is characterized by a multitude of first shapes extending along the first direction. Each first shape is spaced, along a second direction substantially orthogonal to the first direction, from a neighboring first shape in accordance with a first pitch. Each cell is further characterized by a cell origin including a first cell coordinate associated with the second direction. The first cell coordinate is assigned in accordance with an integer multiple of the first pitch when the computer system is invoked to form the multitude of cells representing the circuit.

According to one embodiment, the computer system is further operative to form at least one block including the multitude of cells, and a block origin including a first block coordinate associated with the second direction. The first block coordinate is assigned in accordance with an integer multiple of the first pitch.

According to one embodiment, the computer system is further configured to form at least one block including the multitude of cells, and a block origin including a second block coordinate associated with the first direction. The second block coordinate is assigned in accordance with an integer multiple of the second pitch.

According to one embodiment of the present invention, a non-transitory computer-readable storage medium including instructions, which when executed by a computer, cause the computer to form a multitude of cells of a circuit. Each cell is characterized by at least first and second boundaries positioned along a first direction. Each cell is further characterized by a multitude of first shapes extending along the first direction. Each first shape is spaced, along a second direction substantially orthogonal to the first direction, from a neighboring first shape in accordance with a first pitch. The first and second boundaries are further positioned in accordance with an integer multiple of the first pitch when the computer is invoked to form the multitude of cells representing the circuit.

According to one embodiment, the instructions further cause the computer to form at least one block including the multitude of cells, and at least third and fourth boundaries positioned along the first direction in accordance with an integer multiple of the first pitch. According to one embodiment, the instructions further cause the computer to form at least one block including the multitude of cells, and at least fifth and sixth boundaries positioned along the second direction in accordance with the second pitch.

According to one embodiment of the present invention, a non-transitory computer-readable storage medium including instructions, which when executed by a computer, cause the computer to form a multitude of cells of a circuit. Each cell is characterized by a multitude of first shapes extending along the first direction. Each first shape is spaced, along a second direction substantially orthogonal to the first direction, from a neighboring first shape in accordance with a first pitch. Each cell is further characterized by a cell origin including a first cell coordinate associated with the second direction. The first cell coordinate is assigned in accordance with an integer multiple of the first pitch when the computer is invoked to form the multitude of cells representing the circuit.

According to one embodiment, the instructions further cause the computer to form at least one block including the multitude of cells, and a block origin including a first block coordinate associated with the second direction. The first block coordinate is assigned in accordance with an integer multiple of the first pitch. According to one embodiment, the instructions further cause the computer to form at least one block including the multitude of cells, and a block origin including a second block coordinate associated with the first direction. The second block coordinate is assigned in accordance with an integer multiple of the second pitch.

A better understanding of the nature and advantages of the embodiments of the present invention may be gained with reference to the following detailed description and the accompanying drawings.

BRIEF DESCRIPTION OF THE DRAWINGS

FIG. 7A depicts a simplified exemplary technique for designing a circuit while satisfying special fin placement constraints for designs using Fin-FET technology, in accordance with one embodiment of the present invention.

FIG. 7B depicts a simplified exemplary technique for designing a circuit while satisfying special gate placement constraints for designs using Fin-FET technology, in accordance with one embodiment of the present invention.

DETAILED DESCRIPTION

Figure 1:
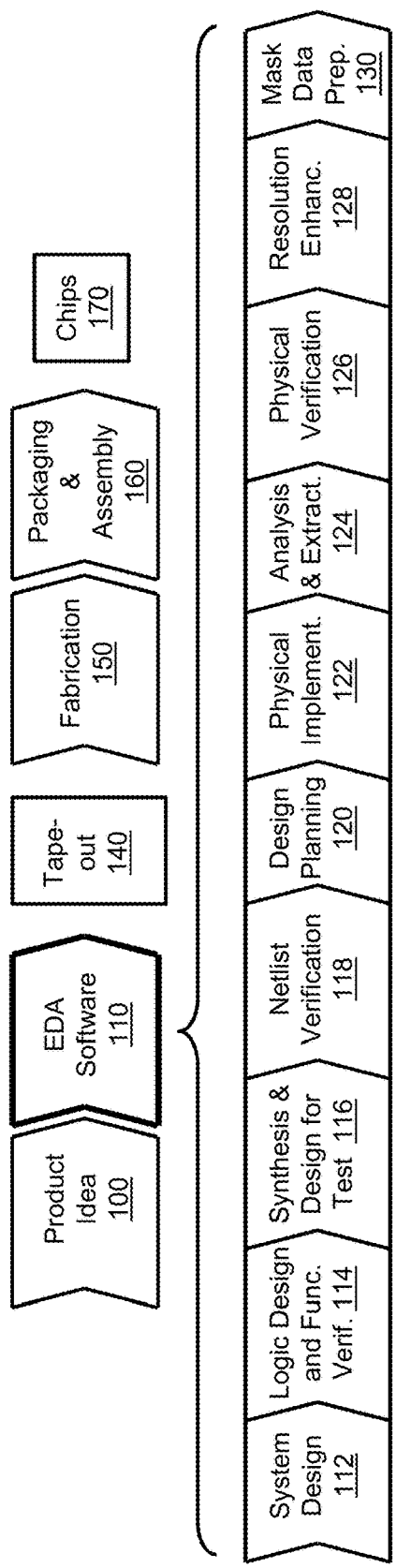
FIG. 1 depicts simplified exemplary steps in the design and fabrication of an integrated circuit that may use embodiments of the present invention.

FIG. 1 depicts simplified exemplary steps in the design and fabrication of an integrated circuit that may use embodiments of the present invention. The process starts with a product idea 100, which is realized using Electronic Design Automation (EDA) software 110. Chips 170 can be produced from the finalized design by performing fabrication 150 and packaging and assembly 160 steps. An exemplary design flow that uses EDA software 110 is described below for illustration purposes only. For example, an actual integrated circuit design may require a designer to perform the design flow steps in a different sequence than the sequence described below.

In the system design 112, a designer describes the functionality to be implemented. The designer can also perform what-if planning to refine the functionality and to check costs. Further, hardware-software architecture partitioning can occur at this step. In the design and functional verification 114, a Hardware Description Language (HDL) design may be created and checked for functional accuracy.

In the synthesis and design 116, the HDL code can be translated to a netlist, which can be optimized for the target technology. Further, tests can be designed and implemented to check the finished chips. In the netlist verification 118, the netlist can be checked for compliance with timing constraints and for correspondence with the HDL code. In the design planning 120, an overall floor plan for the chip can be constructed and analyzed for timing and top-level routing. Next, in the physical implementation 122, placement and routing can be performed.

In the analysis and extraction 124, the circuit functionality can be verified at a transistor level. In the physical verification 126, the design can be checked to correct any functional, manufacturing, electrical, or lithographic issues. In the resolution enhancement 128, geometric manipulations can be performed on the layout to improve manufacturability of the design. Finally, in the mask data preparation 130, the design can be taped-out 140 for production of masks to produce finished chips. The embodiments of the present invention may be used, for example during the step of design planning 120, without necessitating changes to the remaining steps in the Electronic Design Automation (EDA) software 110 flow.

Figures 2A, 2B, 2C:
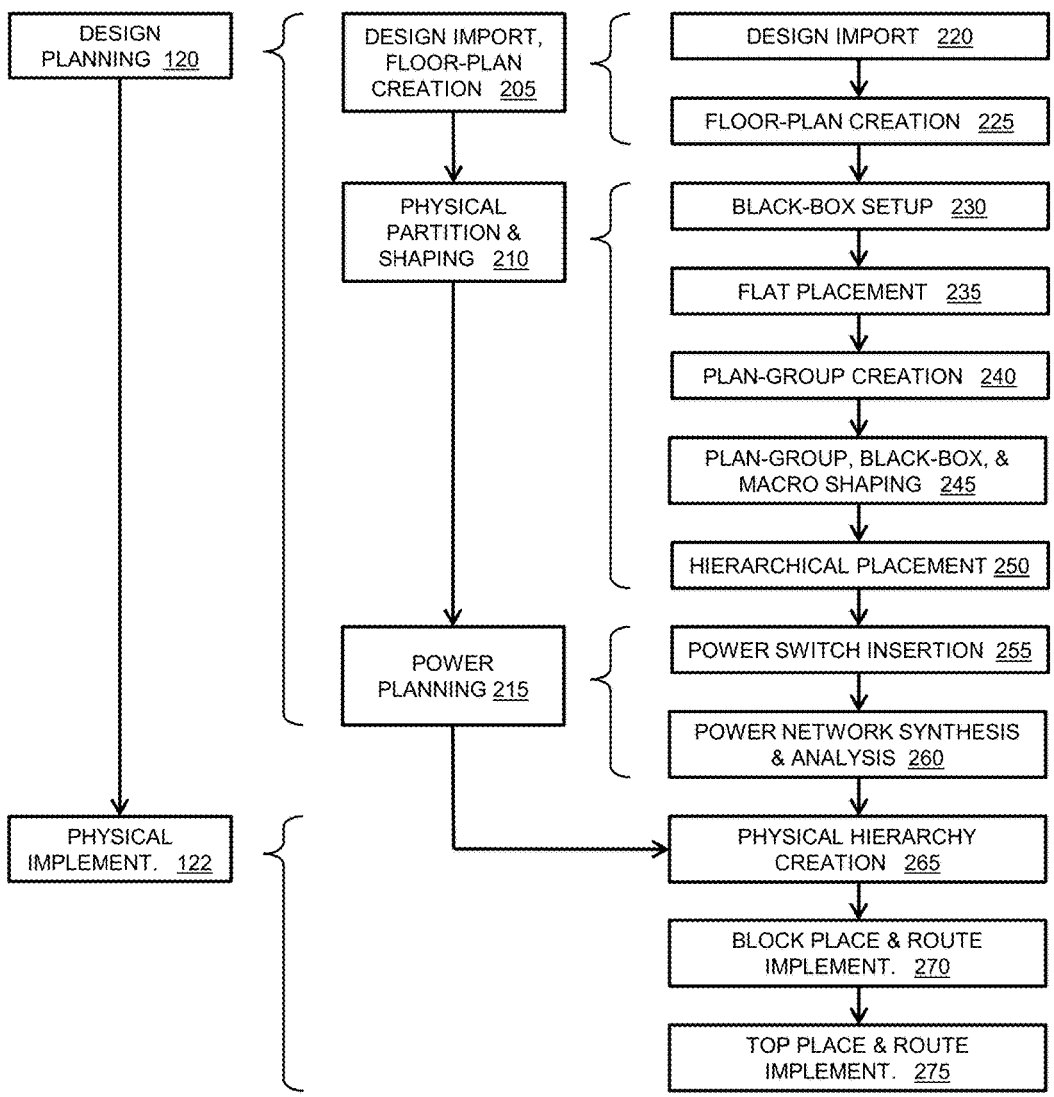
FIG. 2A depicts the simplified exemplary steps of design planning and physical implementation depicted in FIG. 1 that may use embodiments of the present invention.
FIG. 2B depicts details of the simplified exemplary step of design planning depicted in FIG. 2A for an exemplary automated design flow that may use embodiments of the present invention.
FIG. 2C depicts greater detail in the simplified exemplary steps of design import, floor-plan creation, physical partition & shaping, power planning, and physical implementation depicted in FIGS. 2A and 2B that may use embodiments of the present invention.

FIG. 2A depicts the simplified exemplary steps of design planning 120 and physical implementation 122 depicted in FIG. 1. FIG. 2B depicts details of the simplified exemplary step of design planning 120 depicted in FIG. 2A for an exemplary automated design flow. FIG. 2B depicts an example that automates the design planning stage hierarchically using an integrated circuit (IC) physical design tool (PDT), such as for example the IC compiler (ICC) supplied by Synopsys, Inc. In this example, automated design planning 120 may include the steps of design import, floor-plan creation 205, physical partition & shaping 210, and power planning 215, which will be described in reference to FIG. 2C.

FIG. 2C depicts greater detail in the simplified exemplary steps of design import, floor-plan creation 205, physical partition & shaping 210, power planning 215, and physical implementation 122 depicted in FIGS. 2A and 2B. FIG. 2C depicts the design import, floor-plan creation 205 includes design import 220 of the circuit design's net-list, which describes the connectivity and circuit elements of the design usually represented in a hardware description language (HDL) such as Verilog, or VHDL, when the PDT running on the computer is invoked to hierarchically form or place the multitude of layout cells representing the circuit. Next, the PDT creates 225 or initializes the floor-plan, which creates cells for the expected die area, logic core, I/O pads, and defines cell rows within the logic core, that anticipate the amount of area the layout shapes that will be added later will need to implement the design. A large number of cell rows may be needed in the logic core. Each cell row includes a multitude of unit tiles. The width of the standard cells should be an integer multiple of the tile width. The height of the standard cells should be equal to the row height (for single-height cells) or an integer multiple of the row height (for multi-height cells). Later, in the placement stage, the software may place the standard cells conforming to the row tiles.

Next FIG. 2C further depicts the physical partition & shaping 210 includes the steps of black-box setup 230, flat placement 235, plan-group creation 240, plan-group, black-box, & macro shaping 245, and hierarchical placement 250.

During black-box setup 230 the PDT creates boundaries for logic modules called black-boxes that are each represented as a separate physical design and may include little or no logic or only partial net-list data. Next, the PDT may perform flat placement 235 of hard macro cells that may be logic modules that are each implemented as separate physical designs, which should not be broken down into smaller standard cells, such as blocks of memory, logic designed by others, analog circuits, and/or the like. The boundaries of hard macros may not be adjusted to change hard macro cell size as soft macro cells may be changed.

Next, the PDT may create 240 plan groups, which may be groups of cells or blocks each different one including logic at the same hierarchy for that block that may be implemented or optimized separately by different design teams. Then the PDT may shape 245 the plan-groups, black-boxes, and macros to optimize size, area, shape, and location in accordance with specified design constraints, such as for example circuit signal timing, or area utilization.

FIG. 2C further depicts power planning 215 may include power switch insertion 255 and power network synthesis & analysis 260. Power switches are layout cells that separate circuits that run at different voltages and circuits that are powered on or off at different times. power network synthesis & analysis 260 determines voltage drop targets and characteristics before committing to circuit routing.

FIG. 2C further depicts physical implementation 122 may include physical hierarchy creation 265, block place & route implementation 270, and top place & route implementation 275. After power planning, the physical hierarchy may be created 265 when the plan groups may be "committed" to real blocks or soft macros, which may be broken down to standard cells while addressing constraints such as logic fan-out and signal timing. Then objects inside the plan groups or cell blocks may be deleted from the top level or flat design hierarchy and pushed down in hierarchy level such that each block owner may do placement of cells and signal routing inside one block with less concern about other blocks or the rest of the higher level design. Then within each block, cell place and route may be implemented 270 usually followed by place and route implementation 275 at the higher top or global hierarchy levels.

Figure 3:
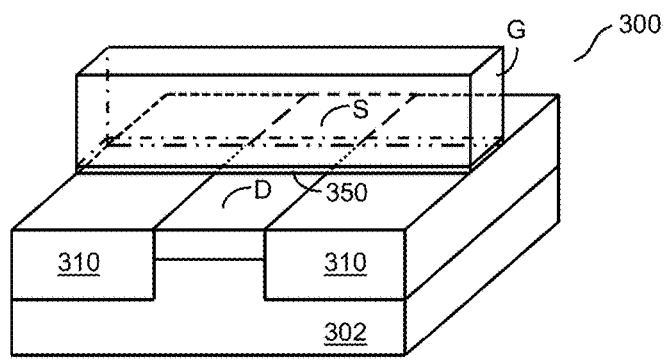
FIG. 3 depicts a simplified exemplary perspective view of an insulated-gate field-effect-transistor (IG-FET).

FIG. 3 depicts a simplified exemplary perspective view of an insulated-gate field-effect-transistor (IG-FET) 300. IG-FET 300 may include a crystalline silicon substrate 302, shallow trench isolation 310 (STI dielectric) formed on each side of a crystalline silicon pedestal, a gate dielectric 350 formed between the crystalline silicon pedestal and a gate, G, formed as a stripe running lengthwise in the plane of FIG. 3 and over STI 310. IG-FET 300 may further include source S and drain D regions formed by implanting dopant atoms into the crystalline silicon pedestal in self aligned fashion on each side of gate G. The power wasted by IG-FET 300 may be limited by leakage currents between D and S that are not under the control of G and may, in aggregate over a multitude of transistors, limit circuit density of an IC due to too much power dissipation.

Figure 4:
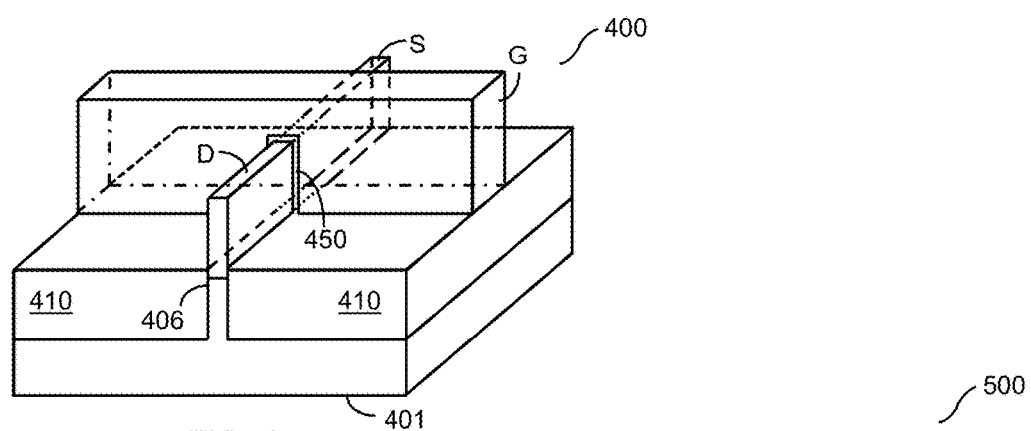
FIG. 4 depicts a simplified exemplary perspective view of a Fin-FET transistor.

FIG. 4 depicts a simplified exemplary perspective view of a Fin-FET transistor 400. Fin-FET transistor 400 may include a portion of starting wafer 401, a fin 406, STI regions 410, gate G formed overlaying and surrounding the portion of fin 406 above STI 410, gate dielectric 450 between the portion of fin 406 above STI 410 and gate G, and S and D doped regions in the portion of fin 406 slightly below the surface of STI 410 and on each side of gate G. The channel region may deplete fully when the gate is biased off because fin 406 is narrow and the gate surrounds the channel on at least two sides, which reduces leakage currents between S and D in the off state of the Fin-FET.

Figure 5:
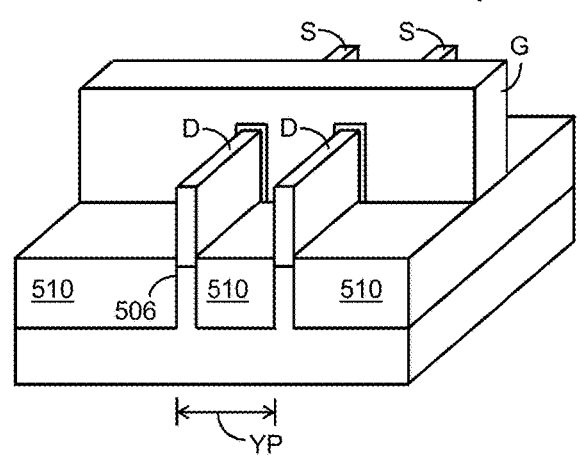
FIG. 5 depicts a simplified exemplary perspective view of a Fin-FET similar to the Fin-FET depicted in FIG. 4 except including a multitude of fins, in accordance with one embodiment of the present invention.

FIG. 5 depicts a simplified exemplary perspective view of a Fin-FET 500 similar to the Fin-FET depicted in FIG. 4 except including a multitude of fins 506, in accordance with one embodiment of the present invention. Fin-FET transistor 500 may include a pair of fins 506 with S and D respectively connected in parallel to form a single FET with double the current drive capability compared to Fin-FET transistor 400. STI 510 may be formed between and on each side of the pair of fins 506. Pair of fins 506 may be manufactured with pitch YP, as depicted by the arrows, using advanced-patterning technology described in greater detail below and providing higher circuit density that achievable using standard-patterning technology.

Figure 6:
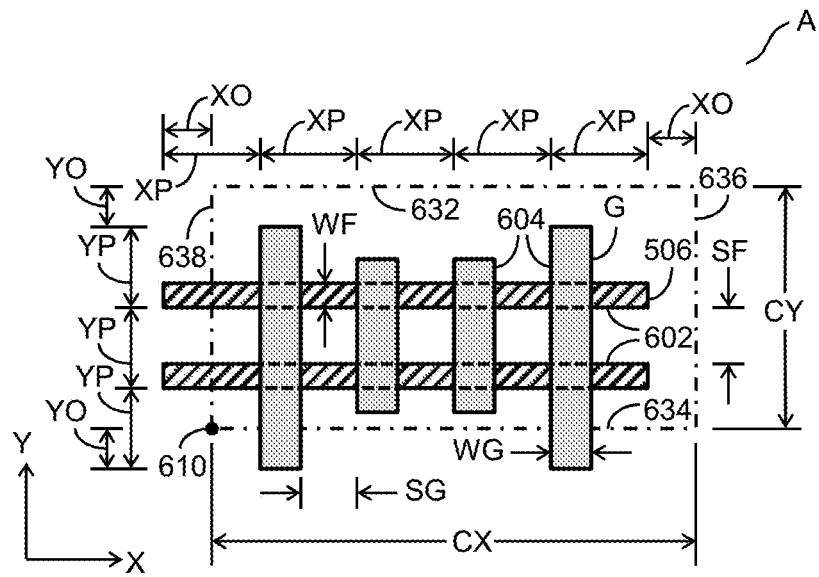
FIG. 6 depicts a simplified exemplary plan view of a layout of a first Fin-FET cell similar to the Fin-FET depicted in FIG. 5 except including a multitude of gates, in accordance with one embodiment of the present invention.

FIG. 6 depicts a simplified exemplary plan view of a layout of a Fin-FET cell A similar to the Fin-FET depicted in FIG. 5 except including a multitude of gates G, in accordance with one embodiment of the present invention. Fin-FET cell A may include a multitude of cell borders 632, 634, 636, 638, a multitude of shapes each associated with a different fin 506 of one or more Fin-FET, a multitude of shapes G each associated with a different gate of the one or more Fin-FET, and a cell origin 610. Each of the different fins 506 extends lengthwise in the x-axis direction as depicted in this example. Each of the different gates G extends lengthwise in the y-axis direction as depicted in this example. It is understood that there may be many other shapes representing other structures, such as for example contacts and/or interconnects, that are placed in the cell but are not shown. In one embodiment Fin-FET cell A may represent one of a multitude of standard cells of a standard cell library.

Although, the invention has been described with reference to x and y orientations for Fin-FET fins 506 and gates G by way of an example, it is understood that the invention is not limited by the type of x and y orientation assigned to the Fin-FET fins 506 and gates G that may be reversed in alternative embodiments so long as the x and y orientations remain positioned substantially orthogonal to each other and the lengthwise directions of Fin-FET fins are positioned substantially orthogonally to Fin-FET gates. In one embodiment, the lengthwise orientation of all Fin-FET fins may be the same throughout the entire die layout. In one embodiment, the fin width substantially perpendicular to the lengthwise direction of each Fin-FET fin may be the same throughout the die layout. In one embodiment, the gate width substantially perpendicular to the lengthwise direction of each Fin-FET gate may be the same throughout the die layout.

FIG. 7A depicts a simplified exemplary technique 700A for designing a circuit while satisfying special fin placement constraints for designs using Fin-FET technology, in accordance with one embodiment of the present invention. Referring simultaneously to FIGS. 6 and 7A, cell A is formed 710, using the computer, such that cell A is characterized by cell boundaries 632, 634 positioned along or running substantially parallel to the x-axis direction, and a multitude of fin shapes 506 each extending along the x-axis direction. In other words each fin of the multitude of fin shapes 506 has a pair of longer fin sides 602 oriented substantially parallel to the x-axis direction.

The minimum fin shape spacing, SF, substantially parallel to the y-axis direction, between each of the fins of the multitude of fin shapes 506 and a closest neighboring (or immediately adjacent) fin shape is in accordance with a fixed fin pitch, YP. YP is the minimum width of the fin shape, WF, in the direction substantially parallel to the y-axis direction, plus SF. In one embodiment, the multitude of fin shapes 506 each have the same WF, and therefore, are spaced with the same SF and further in accordance with the same YP. YP is depicted as starting at the lowermost one of the pair of longer fin sides 602, however it is understood that YP may be offset substantially parallel to the y-axis direction by a fixed amount from one of the pair of longer fin sides 602 in other embodiments without effecting the scope of the invention, so long as the same offset is applied in the same way relative to the position of one of the same longer fin sides 602. In other words, each of the multitude of fin shapes 506 is positioned at equal intervals in the y-axis direction when the longer or lengthwise fin sides 602 of each fin are positioned substantially along the x-axis direction.

The lengthwise positioning of each of the multitude of fin shapes 506 at a fixed fin pitch YP, as described above, is hereinafter referred to as positioning or placing each of the multitude of fin shapes 506 on a "Fin-FET grid" in the y-axis direction and may be considered an additional design rule or constraint for designs using Fin-FET technology. In other words, the Fin-FET grid in the y-axis direction is characterized by an offset in the y-axis direction (not shown because this offset is depicted as equal to zero) plus an integer multiple of YP. The new Fin-FET grid is different from the known "layout grid" where all layout shape edges need to be placed on and that may be at a smaller scale or granularity than the Fin-FET grid. In one embodiment, each of the multitude of fin shapes 506 should be placed on the "Fin-FET grid" as described above and each of the edges of the multitude of fin shapes 506 should be placed on the layout grid, thus satisfying two separate design rule requirements simultaneously.

Further, parallel cell boundaries 632, 634 positioned along or running substantially parallel to the x-axis direction are positioned 710 in accordance with an offset in the y-axis direction, YO, plus an integer multiple of YP, when the computer is invoked to form the multitude of cells representing the circuit. Therefore, the cell size, CY in the direction substantially parallel to the y-axis direction is equal to N×YP, where N is any integer greater than or equal to one. In one preferred embodiment, YO equals zero (not shown). Although cell boundaries 632, 634 do not get printed on the semiconductor wafer and do not represent an element of the electrical net-list, the cell boundaries 632, 634 are important layout constructs used to ensure that all the Fin-FET fins in the layout are positioned properly on the Fin-FET grid as will be explained below. In one embodiment, cell origin 610, which includes a y-coordinate, is positioned on the Fin-FET grid such that the y-coordinate of the cell origin is assigned to a value associated with or on the Fin-FET grid. Later, when cell A is placed in a cell or block at a higher hierarchy level, cell origin 610 is used to control the location of cell A in the higher hierarchy level cell or block. In one embodiment, one of the cell boundary 632, 634, preferably the lower boundary 634, is placed on cell origin 610 as depicted in FIG. 6.

FIG. 7B depicts a simplified exemplary technique 700B for designing a circuit while satisfying special gate placement constraints for designs using Fin-FET technology, in accordance with one embodiment of the present invention. Referring simultaneously to FIGS. 6 and 7B, cell A may be formed 730, using the computer, such that cell A is further characterized by cell boundaries 636, 638 positioned along or running substantially parallel to the y-axis direction, and a multitude of gate shapes G each extending along the y-axis direction. In other words each gate of the multitude of gate shapes G has a pair of longer gate sides 604 oriented substantially parallel to the y-axis direction.

The minimum gate shape spacing, SG, in the direction substantially parallel to the x-axis direction, between each of the gates of the multitude of gate shapes G and a closest neighboring (or immediately adjacent) gate shape is in accordance with a fixed gate pitch, XP. XP is the minimum width of the gate shape, WG in the direction substantially parallel to the x-axis direction, plus SG. In one embodiment, the multitude of gate shapes G each have the same WG, and therefore, are spaced with the same SG and further in accordance with the same XP. XP is depicted as starting at the leftmost one of the pair of longer gate sides 604, however it is understood that XP may be offset substantially parallel to the x-axis direction by a fixed amount from one of the pair of longer gate sides 604 in other embodiments without effecting the scope of the invention, so long as the same offset is applied in the same way relative to the position of one of the same longer gate sides 604. In other words, each of the multitude of gate shapes G is positioned at equal intervals in the x-axis direction when the longer or lengthwise gate sides 604 of each gate are positioned substantially along the y-axis direction.

The lengthwise positioning of each of the multitude of gate shapes G at a fixed gate pitch XP, as described above, is hereinafter referred to as positioning or placing each of the multitude of gate shapes G on a "Fin-FET grid" in the x-axis direction and may be considered an additional design rule for designs using Fin-FET technology. In other words, the Fin-FET grid in the x-axis direction is characterized by an offset in the x-axis direction (not shown because this offset is depicted as equal to zero) plus an integer multiple of XP. In one embodiment, each of the multitude of gate shapes G should be placed on the "Fin-FET grid" as described above and each of the edges of the multitude of gate shapes G should be placed on the layout grid, thus satisfying two separate design rule requirements simultaneously.

Further, cell boundaries 636, 638 positioned along or running substantially parallel to the y-axis direction are positioned 710 in accordance with an offset in the x-axis direction, XO, plus an integer multiple of XP, when the computer is invoked to form the multitude of cells representing the circuit. Therefore, the cell size, CX in the direction substantially parallel to the x-axis direction is equal to N×XP, where N is any integer greater than or equal to one. The depicted CX in this example is 5×XP. In one preferred embodiment, XO equals zero (not shown). Although cell boundaries 636, 638 do not get printed on the semiconductor wafer and do not represent an element of the electrical net-list, the cell boundaries 636, 638 are important layout constructs used to ensure that all the Fin-FET gates in the layout are positioned properly on the Fin-FET grid as will be explained below. In one embodiment, cell origin 610, which includes a x-coordinate, is positioned on the Fin-FET grid such that the x-coordinate is assigned to a value associated with or on the Fin-FET grid. In one embodiment, one of the cell boundary 636, 638, preferably the left boundary 638, is placed on cell origin 610. Hard macros may have cell boundaries and/or cell origins that may need manual placement adjustment when placed in higher level hierarchy cells. Although, the invention has been described with reference to cell boundaries 632, 634, 636, 638 that form a rectangular cell boundary by way of an example, it is understood that the invention is not limited to rectangular shaped cell boundaries. Alternative embodiments may be used to describe more complicated rectilinear cell boundary shapes such as for example "L" shaped cells so long as each cell boundary shape has at least one edge in the x- and/or y-axis direction satisfying the constraints described above.

Figure 8:
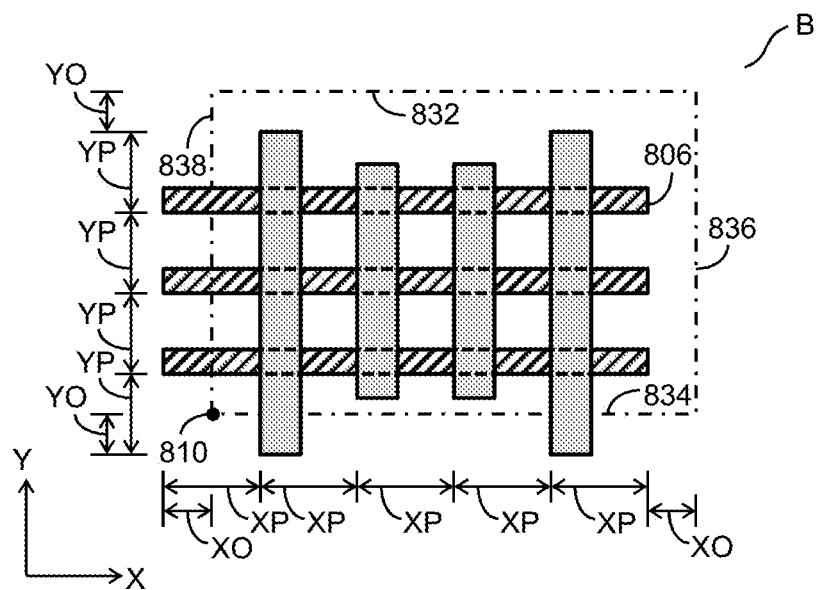
FIG. 8 depicts a simplified exemplary plan view of a layout of a second Fin-FET cell similar to the first Fin-FET cell depicted in FIG. 6 except including three rows of fins, in accordance with one embodiment of the present invention.

FIG. 8 depicts a simplified exemplary plan view of a layout of a Fin-FET cell B similar to Fin-FET cell A depicted in FIG. 6 except including three rows of fins 806, in accordance with one embodiment of the present invention. Therefore, the size of Fin-FET cell B in the y-axis direction is 4×YP instead of 3×YP for Fin-FET cell A as depicted in FIG. 6. Fin-FET cell B includes cell boundaries 832, 834, 836, 838, which have similar positioning characteristics with regard to YO, YP, XO, XP as do 632, 634, 636, 638 respectively as referred to above in FIG. 6. Fin-FET cell B further includes cell origin 810, which may have similar characteristics with regard to positioning and coordinate assignment as does cell origin 610 referred to above in FIG. 6.

Figure 9:
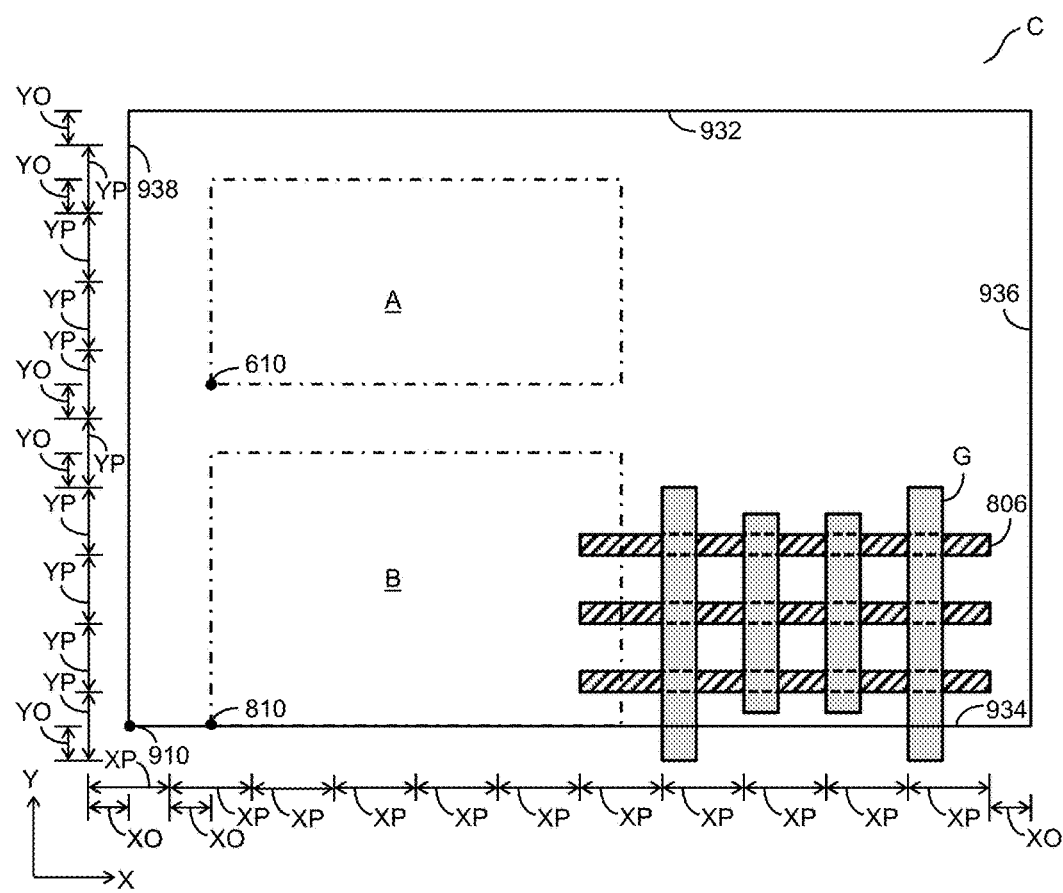
FIG. 9 depicts a simplified exemplary plan view of a layout of a Fin-FET block, in accordance with one embodiment of the present invention.

FIG. 9 depicts a simplified exemplary plan view of a layout of a Fin-FET block C, in accordance with one embodiment of the present invention. Fin-FET block C includes a multitude of Fin-FET fins 806 and a multitude of Fin-FET gates G similar to the shape layout for Fin-FET cell B depicted in FIG. 8. Fin-FET block C further includes a block origin 910 with similar function as cell origins 610, 810. Referring simultaneously to FIGS. 9 and 7A, Fin-FET block C is formed 720, using the computer, such that Fin-FET block C includes cell origin placements or instantiations of cell origin 610 of Fin-FET cell A depicted in FIG. 6 and cell origin 810 of Fin-FET cell B depicted in FIG. 8. Fin-FET block C may therefore be considered at a higher level of cell hierarchy than either Fin-FET cell A or Fin-FET cell B because Fin-FET block C has instantiations for Fin-FET cell A and/or Fin-FET cell B. Fin-FET block C further includes block boundaries 932, 934 positioned along or running substantially parallel to the x-axis direction that are positioned in accordance with YO, plus an integer multiple of YP analogous to the Fin-FET cell A boundaries 632, 634 described in reference to FIG. 6. In one embodiment, block origin 910, which includes a y-coordinate, is positioned on the Fin-FET grid such that the y-coordinate of block origin 910 is assigned to a value associated in accordance with YO, plus an integer multiple of YP or on the Fin-FET grid. In one embodiment, one of the block boundary 932, 934, preferably the lower boundary 934, is placed on block origin 910. FIG. 9 depicts just the cell instantiation, shape, and block boundary structures found at the higher hierarchy level of Fin-FET block C, without displaying any lower hierarchy structures such as the shapes depicted in FIGS. 6 and 8.

Referring simultaneously to FIGS. 9 and 7B, Fin-FET block C is formed 740, using the computer, such that Fin-FET block C further includes block boundaries 936, 938 positioned along or running substantially parallel to the y-axis direction that are positioned in accordance with XO, plus an integer multiple of XP analogous to the Fin-FET cell A boundaries 636, 638 described in reference to FIG. 6. In one embodiment, block origin 910, which includes a x-coordinate, is positioned on the Fin-FET grid such that the x-coordinate is assigned to a value associated with or on the Fin-FET grid. In one embodiment, one of the cell boundary 936, 938, preferably the left boundary 938, is placed on cell origin 910.

Referring simultaneously to FIGS. 7A and 7B in one embodiment, the PDT may perform steps 710 and 730 concurrently or in parallel followed by parallel performed steps 720 and 740 as indicated by the dashed lines in FIGS. 7A and 7B.

Figure 10:
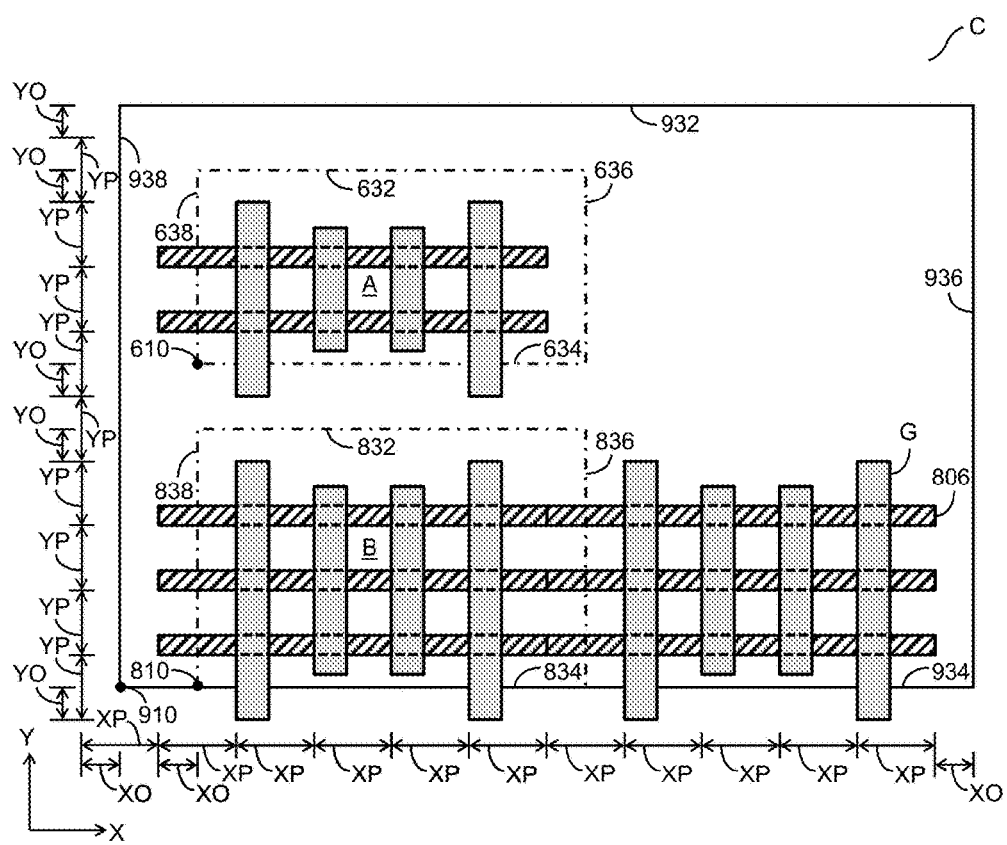
FIG. 10 depicts a simplified exemplary plan view of a layout of the Fin-FET block depicted in FIG. 9 and depicting the contents of cells placed at lower levels of hierarchy, in accordance with one embodiment of the present invention.

FIG. 10 depicts a simplified exemplary plan view of a layout of Fin-FET block C depicted in FIG. 9 and depicting the contents of cells placed at lower levels of hierarchy, in accordance with one embodiment of the present invention. FIG. 10 demonstrates that, following the embodiments described above and when Fin-FET cell A and Fin-FET cell B are each instantiated in Fin-FET block C such that cell boundaries 632, 634 of Fin-FET cell A and cell boundaries 832, 834 of Fin-FET cell B are positioned in accordance with YO plus an integer multiple of YP, then it follows that the longitudinal axes of each of the multitude of Fin-FET fins 806 in each of Fin-FET cell A, Fin-FET cell B, Fin-FET block C are positioned properly on the Fin-FET grid in the y-axis direction. In one embodiment, FIG. 10 further demonstrates that, following the embodiments described above and when Fin-FET cell A and Fin-FET cell B are each instantiated in Fin-FET block C such that the y-coordinate of cell origin 610 of Fin-FET cell A and the y-coordinate of cell origin 810 of Fin-FET cell B are assigned a value in accordance with YO plus an integer multiple of YP, then it follows that the longitudinal axes of each of the multitude of Fin-FET fins 806 in each of these cells are positioned properly on the Fin-FET grid in the y-axis direction.

Fin-FET block C is called a block by example, however, it is understood that a block may be considered just another cell that has other cell instantiations placed therein. Similarly, when all cells containing shapes for Fin-FET fins at all hierarchy levels for the entire layout are provided the same positioning constraints as Fin-FET cell A, Fin-FET cell B, Fin-FET block C as described above, then it follows that the longitudinal axes of all Fin-FET fins in the whole layout are positioned correctly on the Fin-FET grid in the y-axis direction. It is noted that near the interface between Fin-FET cell A and Fin-FET cell B there are two fins intentionally omitted, but that the fins immediately adjacent the resulting "fin channels" resume the proper placement following the desired pitch YP on the Fin-FET grid in the y-axis direction. In one embodiment, Fin-FET cell A, Fin-FET cell B, Fin-FET block C may each include placement coordinates (x, y) in respective cell and block origins 610, 810, 910, and when the cells (or blocks) are placed or instantiated, the placement coordinates (x, y) are placed on the Fin-FET grid such that $x = XP \times N$, and/or $y = YP \times N$, where $N$ = any integer number value $\geq 1$.

FIG. 10 further demonstrates that, following the embodiments described above and when Fin-FET cell A and Fin-FET cell B are each instantiated in Fin-FET block C such that cell boundaries 636, 638 of Fin-FET cell A and cell boundaries 836, 838 of Fin-FET cell B are positioned in accordance with XO plus an integer multiple of XP, then it follows that the longitudinal axes of the multitude of Fin-FET gates G in each of Fin-FET cell A, Fin-FET cell B, Fin-FET block C are positioned properly on the Fin-FET grid in the x-axis direction. In one embodiment, block origin 910, which includes a x-coordinate, is positioned on the Fin-FET grid such that the x-coordinate is assigned to a value associated in accordance with XO, plus an integer multiple of XP or on the Fin-FET grid. In one embodiment, one of the block boundary 936, 938, preferably the left boundary 938, is placed on block origin 910. It is understood that properly positioning the cell origin on the Fin-FET grid as described above, independent of where the cell boundaries may be positioned relative to the cell origin may be sufficient to ensure the fin and/or gate shapes follow the Fin-FET grid design rule.

Similarly, when all cells containing shapes for Fin-FET gates at all hierarchy levels for the entire layout are provided the same positioning constraints as Fin-FET cell A, Fin-FET cell B, Fin-FET block C as described above, then it follows that the longitudinal axes of all Fin-FET gates in the whole layout are positioned correctly on the Fin-FET grid in the x-axis direction. It is noted that near the interface between Fin-FET cell B and Fin-FET block C there is a gate intentionally omitted, but that the gates immediately adjacent the resulting "gate channel" resume the proper placement following the desired pitch XP on the Fin-FET grid in the x-axis direction.

Although, the invention has been described with reference to the use of XO, YO to the positioning of cell boundaries by way of an example, it is understood that the invention is not limited by the use of XO, YO to the positioning of cell boundaries. Alternatively, it is understood that in other embodiments (not shown) XO, YO may be applied instead to the positioning of Fin-FET fin and/or gate. Similarly, in another alternative embodiment YO may be applied to the Fin-FET fin while the cell boundary along the x-axis direction may have zero offset, while the Fin-FET gate shapes may have zero offset and the cell boundary along the y-axis direction may have an offset XO applied. In yet another embodiment, XO and YO offsets may simply be set to zero. Various combinations of offset application are possible without limiting the invention, so long as the offsets are applied the same way to every cell to be forced to the Fin-FET grid, and so long as the Fin-FET fins and/or gates are finally placed so as to be positioned on the same Fin-FET grid, which is consistent throughout a region of the die layout as required by the Fin-FET technology design rules.

Figures 11A, 11B:
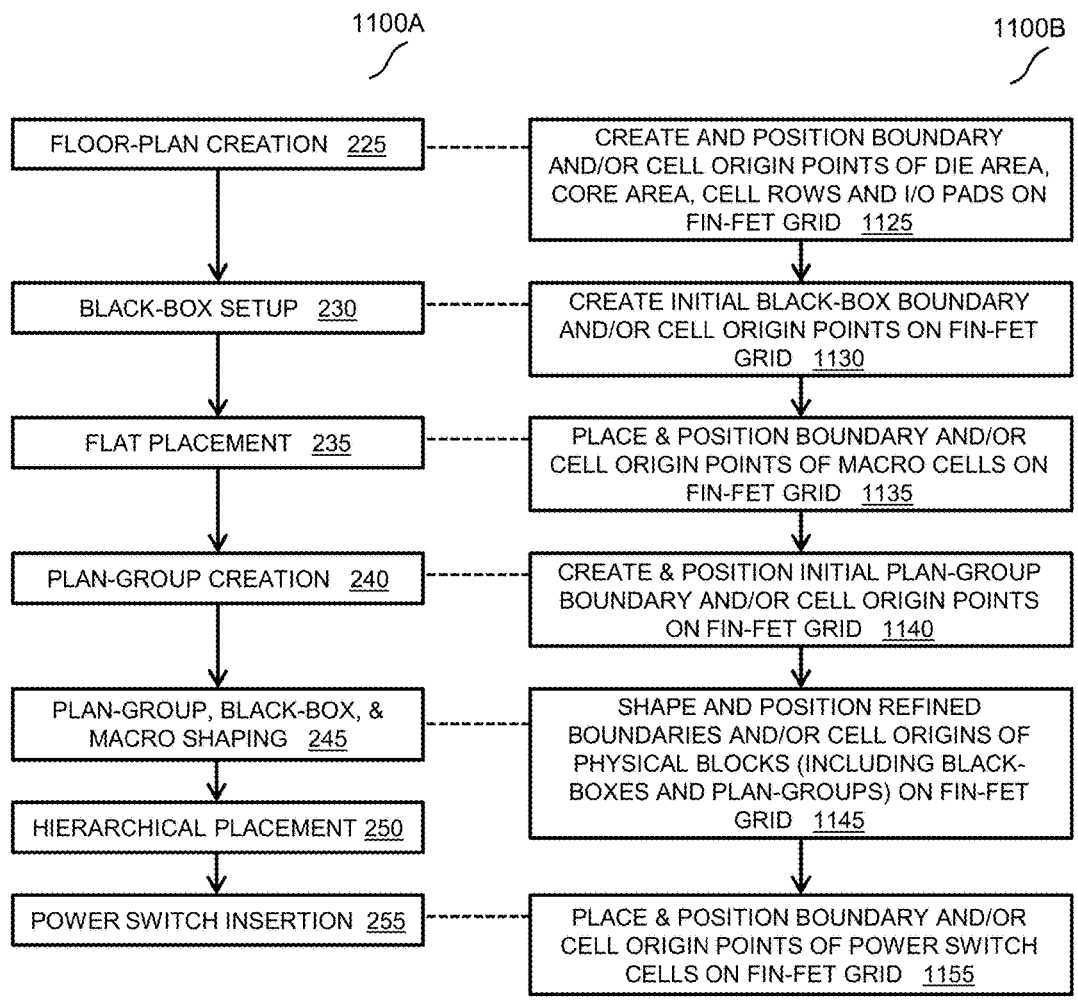
FIG. 11A depicts a portion of the detailed steps of the design planning step depicted in FIGS. 2A-2C.
FIG. 11B depicts a simplified exemplary technique that modifies some of the steps depicted in FIG. 11A, in accordance with one embodiment of the present invention.

FIG. 11A depicts a portion 1100A of the detailed steps of design planning step 120 depicted in FIGS. 2A-2C. FIG. 11B depicts a simplified exemplary technique 1100B that modifies some of the steps depicted in FIG. 11A, in accordance with one embodiment of the present invention. One significant advantage of the embodiments of the invention described above is that modifications to design planning step 120 may be used to implement the embodiments of the invention without adding additional steps and without affecting the rest of the steps in the EDA software 110 steps referred to in FIG. 1. Confining the requisite software modifications to design planning step 120 reduces significant software customization work when adding the embodiments described herein.

The modifications to the design planning step 120 ensure that, whenever a cell boundary is created or modified, that boundary is positioned or repositioned on the Fin-FET grid as described above in reference to FIGS. 6-10, thereby forcing;

cell width (along the x-axis direction) = $XP \times N$, and/or cell height (along the y-axis direction) = $YP \times N$, where $N$ = any integer number value $\geq 1$.

The rules above may be referred to as a Fin-FET design rule. For cells having rectilinear or non-rectangular cell shapes, the same Fin-FET design rule may be applied across any cross section through the cell along the x-axis direction and/or y-axis direction. Another advantage to cells or blocks created following the embodiments is that such cells or blocks can be easily re-used or referenced in another top level design without additional Fin-FET grid adjustment. In one embodiment, for any rectilinear cell boundary shape, forcing the corners of the shape to the Fin-FET grid accomplishes forcing the cell boundaries to the Fin-FET grid.

Referring simultaneously to FIG. 11A and FIG. 11B, during the step of floor-plan creation 225 step, the PDT may create and position 1125 boundary and/or cell origin points of the die area, core area, cell rows and I/O pads on the Fin-FET grid. In other words, since existing standard cell placement conforms to cell row sites, the embodiments force site rows be adjusted to the FinFET grid in the design planning stage. The creation and positioning of boundary and/or cell origin points of cell row sites and unit tiles placed in the cell row sites on the Fin-FET grid ensures that the standard cells (also created in accordance with the embodiments) will later be positioned properly on the Fin-FET grid as well. Then, during the step of black-box setup 230, the initial black-box boundaries are created 1130 such that the boundary and/or cell origin points of the black-boxes are created on the Fin-FET grid. Then, during the step of flat placement 235, the boundary and/or cell origin points of soft macro cells are placed and positioned 1135 on the Fin-FET grid.

Next, during the step of plan-group creation 240, the PDT may create and position 1140 initial boundary and/or cell origin points of the plan-groups on the Fin-FET grid. In other words, for hierarchical designs, the embodiments adjust the block design when partitioning the top level design. When block owners are implanting the block design, they may not need to consider the top level information. If the cells inside a block meet the Fin-FET grid placement design rule relative to the block, then both the cells and the block are guaranteed to meet the Fin-FET grid placement design rule relative to the top level design hierarchy. Next, during the step of plan-group, black-box & macro shaping 245, the PDT may shape and reposition 1145 refined boundary and/or cell origin points of physical blocks or cells such as the plan-groups, black-boxes, and macros on the Fin-FET grid.

In this example, no modifications to hierarchical placement 250 are made. Then, during the step of power switch insertion 255, the boundary and/or cell origin points of power switch cells are placed and positioned 1155 on the Fin-FET grid. The above sequence of modifications plus the requirements that all Fin-FET fins and/or gates be positioned or laid-out in accordance with the embodiments described above in reference to FIGS. 6-10, results in Fin-FET fins and/or gates being properly positioned on the Fin-FET grid, which is carried forward throughout the rest of the automated design sequence of steps.

Figure 12:
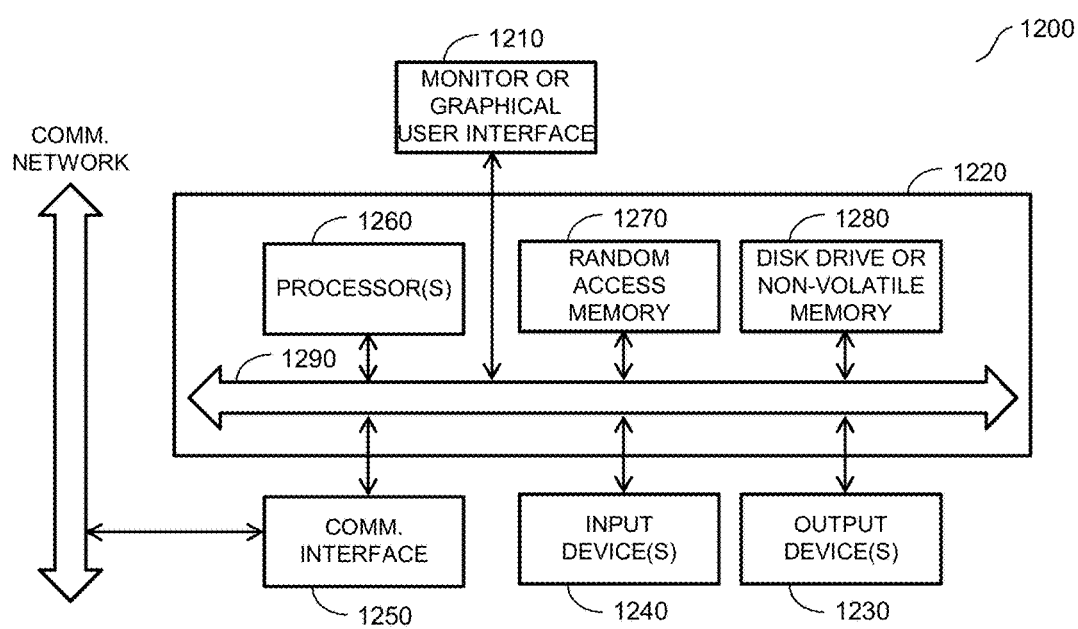
FIG. 12 is a block diagram of a computer system that may incorporate embodiments of the present invention.

FIG. 12 is a block diagram of a computer system that may incorporate embodiments of the present invention. FIG. 12 is merely illustrative of an embodiment incorporating the present invention and does not limit the scope of the invention as recited in the claims. One of ordinary skill in the art would recognize other variations, modifications, and alternatives.

In one embodiment, computer system 1200 typically includes a monitor 1210, a computer 1220, user output devices 1230, user input devices 1240, communications interface 1250, and the like.

As shown in FIG. 12, computer 1220 may include a processor(s) 1260 that communicates with a number of peripheral devices via a bus subsystem 1290. These peripheral devices may include user output devices 1230, user input devices 1240, communications interface 1250, and a storage subsystem, such as random access memory (RAM) 1270 and disk drive 1280.

User input devices 1230 include all possible types of devices and mechanisms for inputting information to computer system 1220. These may include a keyboard, a keypad, a touch screen incorporated into the display, audio input devices such as voice recognition systems, microphones, and other types of input devices. In various embodiments, user input devices 1230 are typically embodied as a computer mouse, a trackball, a track pad, a joystick, wireless remote, drawing tablet, voice command system, eye tracking system, and the like. User input devices 1230 typically allow a user to select objects, icons, text and the like that appear on the monitor 1210 via a command such as a click of a button or the like.

User output devices 1240 include all possible types of devices and mechanisms for outputting information from computer 1220. These may include a display (e.g., monitor 1210), non-visual displays such as audio output devices, etc.

Communications interface 1250 provides an interface to other communication networks and devices. Communications interface 1250 may serve as an interface for receiving data from and transmitting data to other systems. Embodiments of communications interface 1250 typically include an Ethernet card, a modem (telephone, satellite, cable, ISDN), (asynchronous) digital subscriber line (DSL) unit, FireWire interface, USB interface, and the like. For example, communications interface 1250 may be coupled to a computer network, to a FireWire bus, or the like. In other embodiments, communications interfaces 1250 may be physically integrated on the motherboard of computer 1220, and may be a software program, such as soft DSL, or the like.

In various embodiments, computer system 1200 may also include software that enables communications over a network such as the HTTP, TCP/IP, RTP/RTSP protocols, and the like. In alternative embodiments of the present invention, other communications software and transfer protocols may also be used, for example IPX, UDP or the like.

In some embodiment, computer 1220 includes one or more Xeon microprocessors from Intel as processor(s) 1260. Further, one embodiment, computer 1220 includes a UNIX-based operating system.

RAM 1270 and disk drive 1280 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. RAM 1270 and disk drive 1280 may be configured to store the basic programming and data constructs that provide the functionality of the present invention.

Software code modules and instructions that provide the functionality of the present invention may be stored in RAM 1270 and disk drive 1280. These software modules may be executed by processor(s) 1260. RAM 1270 and disk drive 1280 may also provide a repository for storing data used in accordance with the present invention.

RAM 1270 and disk drive 1280 may include a number of memories including a main random access memory (RAM) for storage of instructions and data during program execution and a read only memory (ROM) in which fixed non-transitory instructions are stored. RAM 1270 and disk drive 1280 may include a file storage subsystem providing persistent (non-volatile) storage for program and data files. RAM 1270 and disk drive 1280 may also include removable storage systems, such as removable flash memory.

Bus subsystem 1290 provides a mechanism for letting the various components and subsystems of computer 1220 communicate with each other as intended. Although bus subsystem 1290 is shown schematically as a single bus, alternative embodiments of the bus subsystem may utilize multiple busses.

FIG. 12 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

The above embodiments of the present invention are illustrative and not limiting. Various alternatives and equivalents are possible. Although, the invention has been described with reference to the layout of an exemplary Fin-FET transistor structure by way of an example, it is understood that the invention is not limited by the type of transistor structure so long as shapes on at least one lithography mask layer representing part of the transistor structure may benefit from being disposed on a grid different from the grid used for every shape in the layout. The scope of the invention should, therefore, be determined not with reference to the above description, but instead should be determined with reference to the pending claims along with their full scope or equivalents.

What is claimed is:

1. A computer implemented method for forming a layout of an integrated circuit, the method comprising:
    forming, using the computer, a plurality of cells, each cell characterized by:
    at least first and second boundaries positioned along a first direction; and
    a plurality of first shapes extending along the first direction, each first shape spaced, along a second direction substantially orthogonal to the first direction, from a neighboring first shape in accordance with a first pitch,
    wherein the first and second boundaries are further positioned in accordance with an integer multiple of the first pitch when the computer is invoked to form the plurality of cells representing the circuit wherein the first and second boundaries are further positioned in accordance with a first offset plus an integer multiple of the first pitch, wherein the first pitch is equal to a spacing along the second direction between each first shape and the neighboring first shape plus a width along the second direction of one of the first shapes, wherein the width of each of the plurality of first shapes is the same.

2. A computer implemented method of claim 1, wherein each first shape is associated with a different fin of a fin-field-effect-transistor (Fin-FET).

3. A computer implemented method of claim 1, wherein the first and second boundaries are further positioned in accordance with a first offset plus an integer multiple of the first pitch.

4. A computer implemented method of claim 1, wherein the first and second boundaries are associated with a cell selected from the group consisting of an integrated circuit die area, a logic core area, a I/O pad, a row, a tile, a standard cell, a soft macro, a black-box, a plan-group, and a power switch.

5. A computer implemented method of claim 1 further comprising forming, using the computer, at least one block including:
    the plurality of cells; and at least third and fourth boundaries positioned along the first direction in accordance with an integer multiple of the first pitch.

6. A computer implemented method of claim 5, wherein the third and fourth boundaries are further positioned in accordance with a first offset plus an integer multiple of the first pitch.

7. A computer implemented method of claim 5, wherein the plurality of cells are each instantiated in the at least one block such that the first and second boundaries are positioned in accordance with a first offset plus an integer multiple of the first pitch.

8. A computer implemented method of claim 1, wherein each cell is further characterized by:

at least third and fourth boundaries positioned along the second direction; and a plurality of second shapes extending along the second direction, each second shape spaced, along the first direction, from a neighboring second shape in accordance with a second pitch, wherein the third and fourth boundaries are further positioned in accordance with an integer multiple of the second pitch.

9. A computer implemented method of claim 8, wherein the second pitch is equal to a spacing along the first direction between each second shape and the neighboring second shape plus a width along the first direction of one of the second shapes, wherein the width of each of the plurality of second shapes is the same.

10. A computer implemented method of claim 8, wherein each second shape is associated with a different gate of a FIN-FET.

11. A computer implemented method of claim 8, wherein the third and fourth boundaries are further positioned in accordance with a second offset plus an integer multiple of the second pitch.

12. A computer implemented method of claim 8, wherein the third and fourth boundaries are associated with a cell selected from the group consisting of an integrated circuit die area, a logic core area, an I/O pad, a row, a tile, a standard cell, a soft macro, a black-box, a plan-group, and a power switch.

13. A computer implemented method of claim 8 further comprising forming, using the computer, at least one block including:
the plurality of cells; and
at least fifth and sixth boundaries positioned along the second direction in accordance with the second pitch.

14. A computer implemented method of claim 13, wherein the fifth and sixth boundaries are further positioned in accordance with a second offset plus an integer multiple of the second pitch.

15. A computer implemented method of claim 13, wherein the plurality of cells are each instantiated in the at least one block such that the third and fourth boundaries are positioned in accordance with the second offset plus an integer multiple of the second pitch.

16. A computer system operative to form a layout of an integrated circuit, the computer system further operative to:
form a plurality of cells of a circuit, each cell characterized by:
at least first and second boundaries positioned along a first direction; and
a plurality of first shapes extending along the first direction, each first shape spaced, along a second direction substantially orthogonal to the first direction, from a neighboring first shape in accordance with a first pitch,
wherein the first and second boundaries are further positioned in accordance with an integer multiple of the first pitch when the computer system is invoked to form the plurality of cells representing the circuit, wherein the first pitch is equal to a spacing along the second direction between each first shape and the neighboring first shape plus a width along the second direction of one of the first shapes, wherein the width of each of the plurality of first shapes is the same.

17. The computer system of claim 16, wherein each first shape is associated with a different fin of a fin-field-effect-transistor (Fin-FET).

18. The computer system of claim 16, wherein the first and second boundaries are further positioned in accordance with a first offset plus an integer multiple of the first pitch.

19. The computer system of claim 16, wherein the first and second boundaries are associated with a cell selected from the group consisting of an integrated circuit die area, a logic core area, a 1/0 pad, a row, a tile, a standard cell, a soft macro, a black-box, a plan-group, and a power switch.

20. The computer system of claim 16 further operative to form at least one block including:
the plurality of cells; and
at least third and fourth boundaries positioned along the first direction in accordance with an integer multiple of the first pitch.

21. The computer system of claim 20, wherein the third and fourth boundaries are further positioned in accordance with a first offset plus an integer multiple of the first pitch.

22. The computer system of claim 20, wherein the plurality of cells are each instantiated in the at least one block such that the first and second boundaries are positioned in accordance with a first offset plus an integer multiple of the first pitch.

23. The computer system of claim 16, wherein each cell is further characterized by:
at least third and fourth boundaries positioned along the second direction; and
a plurality of second shapes extending along the second direction, each second shape spaced, along the first direction, from a neighboring second shape in accordance with a second pitch,
wherein the third and fourth boundaries are further positioned in accordance with an integer multiple of the second pitch.

24. The computer system of claim 23, wherein the second pitch is equal to a spacing along the first direction between each second shape and the neighboring second shape plus a width along the first direction of one of the second shapes, wherein the width of each of the plurality of second shapes is the same.

25. The computer system of claim 23, wherein each second shape is associated with a different gate of a FIN-FET.

26. The computer system of claim 23, wherein the third and fourth boundaries are further positioned in accordance with a second offset plus an integer multiple of the second pitch.

27. The computer system of claim 23, wherein the third and fourth boundaries are associated with a cell selected from the group consisting of an integrated circuit die area, a logic core area, an I/O pad, a row, a tile, a standard cell, a soft macro, a black-box, a plan-group, and a power switch.

28. The computer system of claim 23 further operative to form at least one block including:
the plurality of cells; and
at least fifth and sixth boundaries positioned along the second direction in accordance with the second pitch.

29. The computer system of claim 28, wherein the fifth and sixth boundaries are further positioned in accordance with a second offset plus an integer multiple of the second pitch.

30. The computer system of claim 28, wherein the plurality of cells are each instantiated in the at least one block such that the third and fourth boundaries are positioned in accordance with the second offset plus an integer multiple of the second pitch.

31. A non-transitory computer-readable storage medium comprising instructions for forming a layout of an integrated circuit, said instructions stored in a storage medium which when executed by a computer, cause the computer to:
- form a plurality of cells of a circuit, each cell characterized by:
- at least first and second boundaries positioned along a first direction; and
- a plurality of first shapes extending along the first direction, each first shape spaced, along a second direction substantially orthogonal to the first direction, from a neighboring first shape in accordance with a first pitch,
- wherein the first and second boundaries are further positioned in accordance with an integer multiple of the first pitch when the computer is invoked to form the plurality of cells representing the circuit, wherein the first pitch is equal to a spacing along the second direction between each first shape and the neighboring first shape plus a width along the second direction of one of the first shapes, wherein the width of each of the plurality of first shapes is the same.

32. The non-transitory computer-readable storage medium of claim 31, wherein each first shape is associated with a different fin of a fin-field-effect-transistor (Fin-FET).

33. The non-transitory computer-readable storage medium of claim 31, wherein the first and second boundaries are further positioned in accordance with a first offset plus an integer multiple of the first pitch.

34. The non-transitory computer-readable storage medium of claim 31, wherein the first and second boundaries are associated with a cell selected from the group consisting of an integrated circuit die area, a logic core area, a I/O pad, a row, a tile, a standard cell, a soft macro, a black-box, a plan-group, and a power switch.

35. The non-transitory computer-readable storage medium of claim 31, wherein the instructions further cause the computer to form at least one block including:
- the plurality of cells; and
- at least third and fourth boundaries positioned along the first direction in accordance with an integer multiple of the first pitch.

36. The non-transitory computer-readable storage medium of claim 35, wherein the third and fourth boundaries are further positioned in accordance with a first offset plus an integer multiple of the first pitch.

37. The non-transitory computer-readable storage medium of claim 35, wherein the plurality of cells are each instantiated in the at least one block such that the first and second boundaries are positioned in accordance with a first offset plus an integer multiple of the first pitch.

38. The non-transitory computer-readable storage medium of claim 31, wherein each cell is further characterized by:
- at least third and fourth boundaries positioned along the second direction; and
- a plurality of second shapes extending along the second direction, each second shape spaced, along the first direction, from a neighboring second shape in accordance with a second pitch,
- wherein the third and fourth boundaries are further positioned in accordance with an integer multiple of the second pitch.

39. The non-transitory computer-readable storage medium of claim 38, wherein the second pitch is equal to a spacing along the first direction between each second shape and the neighboring second shape plus a width along the first direction of one of the second shapes, wherein the width of each of the plurality of second shapes is the same.

40. The non-transitory computer-readable storage medium of claim 38, wherein each second shape is associated with a different gate of a FIN-FET.

41. The non-transitory computer-readable storage medium of claim 38, wherein the third and fourth boundaries are further positioned in accordance with a second offset plus an integer multiple of the second pitch.

42. The non-transitory computer-readable storage medium of claim 38, wherein the third and fourth boundaries are associated with a cell selected from the group consisting of an integrated circuit die area, a logic core area, a I/O pad, a row, a tile, a standard cell, a soft macro, a black-box, a plan-group, and a power switch.

43. The non-transitory computer-readable storage medium of claim 38, wherein the instructions further cause the computer to form at least one block including:
- the plurality of cells; and
- at least fifth and sixth boundaries positioned along the second direction in accordance with the second pitch.

44. The non-transitory computer-readable storage medium of claim 43, wherein the fifth and sixth boundaries are further positioned in accordance with a second offset plus an integer multiple of the second pitch.

45. The non-transitory computer-readable storage medium of claim 43, wherein the plurality of cells are each instantiated in the at least one block such that the third and fourth boundaries are positioned in accordance with the second offset plus an integer multiple of the second pitch.

* * * * *

UNITED STATES PATENT AND TRADEMARK OFFICE
CERTIFICATE OF CORRECTION

PATENT NO. : 10,817,636 B2
APPLICATION NO. : 14/924323
DATED : October 27, 2020
INVENTOR(S) : Bohai Liu et al.

Page 1 of 1

It is certified that error appears in the above-identified patent and that said Letters Patent is hereby corrected as shown below:

In the Claims

Column 20, Line 7:
Claim 19, delete "1/0" and insert --I/O--

Signed and Sealed this
Eighth Day of December, 2020

Andrei Iancu
*Director of the United States Patent and Trademark Office*